US012621962B2

(12) United States Patent
Lohan et al.

(10) Patent No.: US 12,621,962 B2
(45) Date of Patent: May 5, 2026

(54) CAPILLARY COOLING SYSTEMS FOR COOLING ELECTRONIC DEVICES AND METHODS THEREOF

(71) Applicant: Toyota Motor Engineering & Manufacturing North America, Inc., Plano, TX (US)

(72) Inventors: Danny J. Lohan, Northville, MI (US); Shailesh N. Joshi, Ann Arbor, MI (US); Ercan M. Dede, Ann Arbor, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Toyota (JP)

( * ) Notice: Subject to any disclaimer, the term of this patent is extended or adjusted under 35 U.S.C. 154(b) by 424 days.

(21) Appl. No.: 18/197,194

(22) Filed: May 15, 2023

(65) Prior Publication Data
US 2024/0389277 A1     Nov. 21, 2024

(51) Int. Cl.
*H05K 7/20*          (2006.01)
(52) U.S. Cl.
CPC ..... *H05K 7/20809* (2013.01); *H05K 7/20309* (2013.01); *H05K 7/20318* (2013.01); *H05K 7/20327* (2013.01); *H05K 7/20836* (2013.01)
(58) Field of Classification Search
CPC .......... H05K 7/20309; H05K 7/20318; H05K 7/20327; H05K 7/20809; H05K 7/20836
USPC ....................................... 700/300
See application file for complete search history.

(56) References Cited

U.S. PATENT DOCUMENTS

| | | | | |
|---|---|---|---|---|
| 4,550,574 A | * | 11/1985 | Hohman | F25B 41/00 |
| | | | | 62/196.3 |
| 4,869,313 A | | 9/1989 | Fredley | |
| 5,092,282 A | * | 3/1992 | Danekas | B60H 1/08 |
| | | | | 123/41.21 |
| 5,692,095 A | | 11/1997 | Young | |
| 5,816,313 A | | 10/1998 | Baker | |
| 8,422,218 B2 | | 4/2013 | Fried et al. | |
| 9,012,185 B2 | | 4/2015 | Zhang | |
| 2009/0244830 A1 | * | 10/2009 | Wyatt | H05K 7/20809 |
| | | | | 361/679.47 |
| 2020/0300555 A1 | * | 9/2020 | Holman | F28D 15/043 |
| 2022/0192060 A1 | * | 6/2022 | Joshi | H01L 23/3733 |
| 2022/0361371 A1 | * | 11/2022 | Unton | H05K 7/20818 |

* cited by examiner

*Primary Examiner* — Chun Cao
(74) *Attorney, Agent, or Firm* — DINSMORE & SHOHL LLP

(57)          ABSTRACT

The present disclosure is directed to systems and methods for cooling electronic devices. The system includes a capillary cooler assembly comprising a housing, a plurality of feeding tubes within the housing, a wick within the housing, and one or more vapor outlets, a fluid feed line fluidly coupled to the plurality of feeding tubes, a fluid bypass line fluidly coupled to the fluid feed line, a fluid bypass valve fluidly coupled to the fluid feed line and the fluid bypass line, wherein the fluid bypass valve is selectively operable between at least two positions that control a flow of cooling fluid through the fluid bypass line, a vapor line fluidly coupled to the one or more vapor outlets, a condenser fluidly coupled to the fluid bypass line, the vapor line, and the fluid feed line, and a pump fluidly coupled to the condenser and the fluid feed line.

16 Claims, 7 Drawing Sheets

CAPILLARY COOLING SYSTEMS FOR COOLING ELECTRONIC DEVICES AND METHODS THEREOF

BACKGROUND

Field

The present disclosure relates to systems and methods for cooling electronics.

Technical Background

Electronic devices can be housed in facilities such as data centers and arranged in various setups, such as vertical stacks. Such electronic devices require cooling to maintain the electronic devices at preferred operating temperature. Conventional cooling systems for electronic devices may pump a constant volume of fluid through the electronic devices. This may result in efficient use of electricity to pump more fluid than is necessary, as well as allowing for excessive vapor pressure build up within the cooling system.

SUMMARY

Electronic devices generate heat during operation. In order to operate effectively, electronic devices should be maintained within an ideal operating temperature range. Thus, electronic devices should be cooled. Electronic devices may be arranged in stacks inside facilities wherein the facility requires a large scale cooling system to maintain the electronic devices at a preferred operating temperature. Evaporative cooling systems may be used to cool electronic devices. Evaporative cooling utilizes the phase change of a cooling medium from fluid to vapor to absorb heat during the phase change. The heat may be absorbed from the electronic device. Conventional large scale electronic device cooling systems may pump a constant volume of fluid across electronic devices. This may delay when evaporative cooling begins, and may also more quickly vaporize the cooling medium such that vapor pressure builds up in the system and the electronic device does not draw as much cooling medium as it requires to be maintained at an ideal operating temperature. Therefore, there exists a need for a large scale cooling system which can more efficiently initiate evaporative cooling and control the build-up of vapor pressure in the cooling system.

The present system can more efficiently use electricity to cool electronic devices by utilizing a fluid bypass valve to control the flow cooling fluid across electronic devices. By manipulating the fluid flow with the fluid bypass valve such that a portion of the fluid cools the electronic device and a portion of the fluid bypasses the electronic device and flows directly to the condenser, evaporative cooling may be achieved at a lower power level compared to non-bypassed fluid flow, and evaporative cooling may be maintained over a longer power level range compared to non-bypassed fluid flow.

Embodiments generally include a pump, a fluid feed line wherein the fluid feed line is fluidly coupled to the pump, a bypass line fluidly coupled to the fluid feed line, a fluid bypass valve fluidly coupled to the bypass line, one or more capillary coolers fluidly coupled to the fluid feed line and configured on wicks mounted on one or more electronic devices, a vapor line fluidly coupled to the one or more electronic devices, and a condenser fluidly coupled to the vapor line and the fluid bypass line. The electronic devices may evaporate a fluid and the condenser may condense the fluid. The one or more electronic devices may be arranged in vertical stacks. In some embodiments there may be a controller which is configured to monitor a characteristic of the one or more electronic devices and is further coupled to the pump and/or valve. In some embodiments, the system is arranged in a data center. In other embodiments, the system may be arranged in an automobile.

In one embodiment a system for cooling electronic devices includes one or more electronic devices, a capillary cooler assembly comprising a housing, a plurality of feeding tubes within the housing, a wick within the housing, and one or more vapor outlets, a fluid feed line fluidly coupled to the plurality of feeding tubes, a fluid bypass line fluidly coupled to the fluid feed line, a fluid bypass valve fluidly coupled to the fluid feed line and the fluid bypass line, wherein the fluid bypass valve is selectively operable between at least two positions that control a flow of cooling fluid through the fluid bypass line, a vapor line fluidly coupled to the one or more vapor outlets, a condenser fluidly coupled to the fluid bypass line, the vapor line, and the fluid feed line, and a pump fluidly coupled to the condenser and the fluid feed line.

In another embodiment a method for cooling electronic devices includes the steps of controlling a pump to move a cooling fluid along a fluid feed line toward a capillary cooler coupled to one or more electronic devices, controlling a position of a fluid bypass valve, wherein the fluid bypass valve is fluidly coupled to the fluid feed line and a fluid bypass line, and the fluid bypass line routes the cooling fluid away from the capillary cooler based on the position of the fluid bypass valve.

In yet another embodiment a data center includes one or more electronic devices, a system for cooling the one or more electronic devices including: a capillary cooler assembly comprising a housing, a plurality of feeding tubes within the housing, a wick within the housing, and one or more vapor outlets, a fluid feed line fluidly coupled to the plurality of feeding tubes, a fluid bypass line fluidly coupled to the fluid feed line, a fluid bypass valve fluidly coupled to the fluid feed line and the fluid bypass line, wherein the fluid bypass valve is selectively operable between at least two positions that control a flow of cooling fluid through the fluid bypass line, a vapor line fluidly coupled to the one or more vapor outlets, a condenser fluidly coupled to the fluid bypass line, the vapor line, and the fluid feed line, and a pump fluidly coupled to the condenser and the fluid feed line.

Additional features and advantages of the technology described in this disclosure will be set forth in the detailed description which follows, and in part will be readily apparent to those skilled in the art from the description or recognized by practicing the technology as described in this disclosure, including the detailed description which follows, the claims, as well as the appended drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments disclosed herein include systems and methods for cooling electronic devices. Electronic devices generate heat during operation. Electronic devices may be arranged in groups of electronic devices in facilities such as server buildings or data centers. Such facilities require cooling systems in order to maintain the electronic devices at a preferred operating temperature. Conventional cooling systems can use a large amount of power in order to maintain the electronic devices at the preferred operating temperature, and can result in pressure build-up within the cooling system which may result in insufficient cooling flow to the electronic devices.

The systems and methods address the above issues by including a fluid bypass valve and allowing a portion of the cooling fluid to bypass the electronic device. The fluid bypass valve may be adjusted during operation so a preferred portion of fluid flows to the electronic device. As will be described in greater detail herein, the systems and methods include a pump which can move fluid towards the electronic device. The fluid bypass valve may be opened at various positions so that evaporative cooling may begin at lower power levels and evaporative cooling may be maintained across a larger range of power levels. Vapor pressure may also be controlled by bypassing a portion of the fluid away from the electronic devices. The position of the fluid bypass valve may be modulated to both provide an early transition to evaporative cooling and extend the maximum power of the cooler.

The term "evaporator" refers to the portion of the system where fluid is converted from a fluid to a gas, absorbing heat. The term "condenser" refers to the portion of the system where gas is converted from a gas to a fluid, releasing heat.

Conventional cooling systems may pump a constant volume of fluid through electronic devices. This may use a large amount of electricity by inefficiently utilizing evaporative cooling, and may build up vapor pressure so that the electronic device cannot draw enough fluid to stay sufficiently cool. Embodiments can more efficiently use electricity to cool electronic devices by bypassing a volume of fluid away from the electronic device, and adjusting the amount of fluid bypassed during operation. The present system can further reduce electricity usage by cooling the condenser of the system by geothermal cooling or passive radiative cooling.

Figure 1:
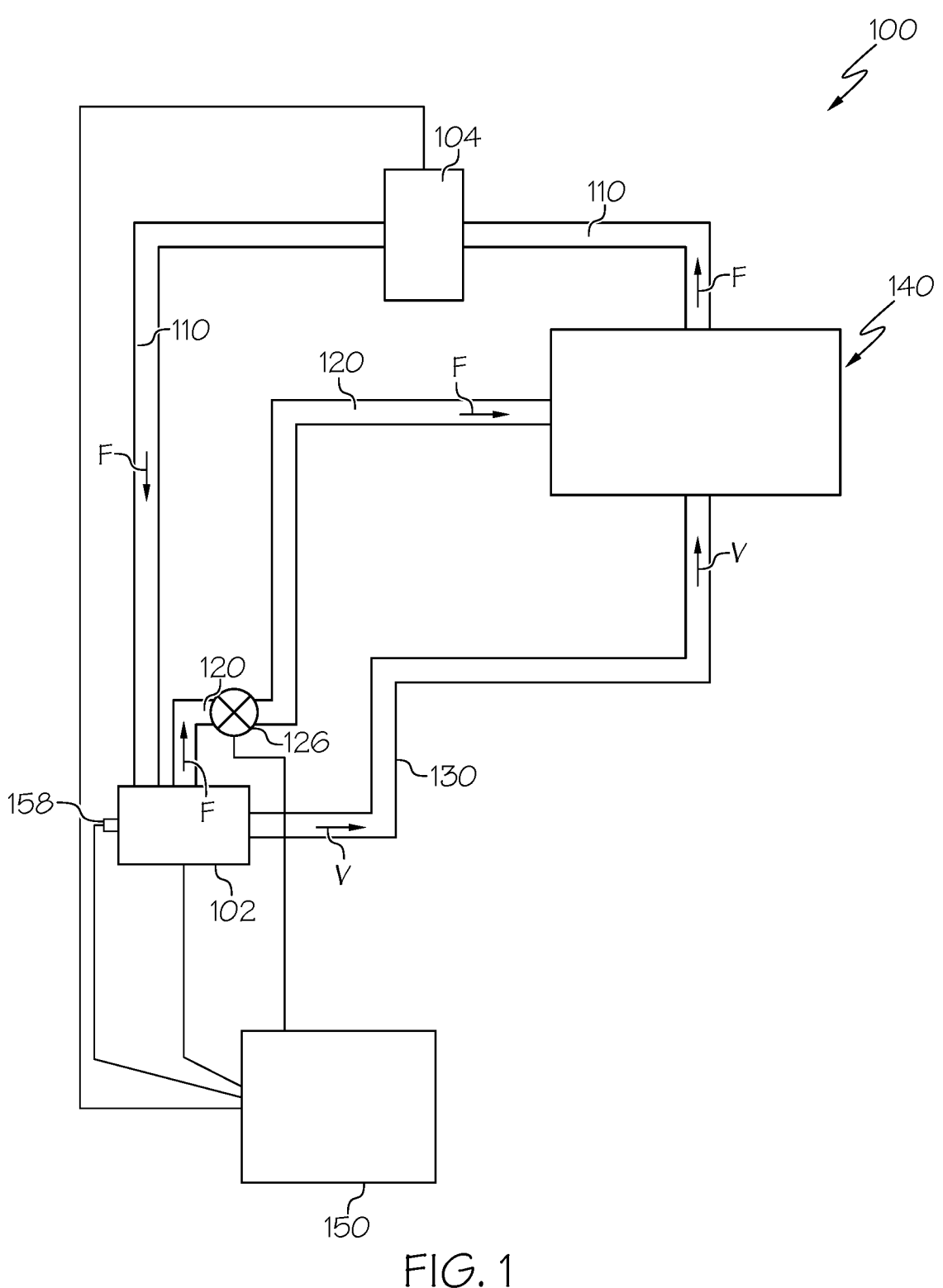
FIG. 1 schematically depicts a system for cooling electronic devices according to one or more embodiments shown and described herein.

Referring now to FIG. 1, an example embodiment of a system 100 for cooling electronic devices is shown. The system 100 generally includes a capillary cooler 102 for cooling one or more electronic devices 105, a pump 104 for assisting in providing fluid to the capillary cooler 102, and a condenser 140 for condensing vapor from the capillary cooler 102 back into liquid.

The components of the system 100 of FIG. 1 are fluidly coupled by various fluid lines. A fluid feed line 110 fluidly couples an output of the condenser to an input of the capillary cooler 102 by way of the pump 104. Thus, the pump 104 assists in moving liquid cooling fluid from the condenser 140 to the capillary cooler 102. As a non-limiting example, the pump 104 may be a positive-displacement pump, centrifugal pump, axial-flow pump, or any other suitable type of pump. Note that while one pump 104 is shown in FIG. 1, any number of pumps can be used. As stated above, the pump 104 is configured to move fluid within the fluid feed line 110. The fluid may be, without limitation, water, glycol-water solutions, dielectric fluid, or any other fluid suitable for cooling electronic devices.

The fluid feed line 110 is coupled to the capillary cooler 102, which is thermally coupled to the one or more electronic devices 105. The fluid flowing into the capillary cooler 102 thus cools the electronic device 105. The one or more electronic devices 105 may be central processing units, graphical processing units, power electronics devices (e.g., insulated metal-gate bi-polar transistors (IGBT), metal-oxide semiconductor field-effect transistors (MOSFET), and the like), or any other electronic devices that may require cooling. As described in more detail below with respect to FIG. 3, the heat generated by the electronic device 105 may evaporate the fluid as the fluid passes over the electronic device 105.

The example system 100 further includes a condenser 140 that is operable to condense a vapor into a liquid. Any known or yet-to-be-developed condenser may be used as the condenser 140. The condenser 140 may be cooled by any appropriate cooling system, including but not limited to geothermal cooling wherein a condenser cooling fluid from the geothermal system is moved from below the ground underneath the facility and the condenser cooling fluid from the geothermal system is passed across the condenser 140 to cool the fluid passing through the condenser 140. The condenser 140 may also be cooled by radiative cooling wherein condenser cooling fluid is moved across a radiative cooling panel which may be a panel of high solar reflectance and with a high thermal radiation heat transfer rate such that the condenser cooling fluid is cooled, and the condenser cooling fluid is then passed across the condenser 140. The condenser 140 may also be cooled by the HVAC system of a facility which houses the electronic device 105, wherein cooled air from a conventional air conditioning system may be moved across the condenser 140. The condenser 140 may also be cooled by other appropriate cooling mechanisms, some of which will be described herein.

Figure 3:
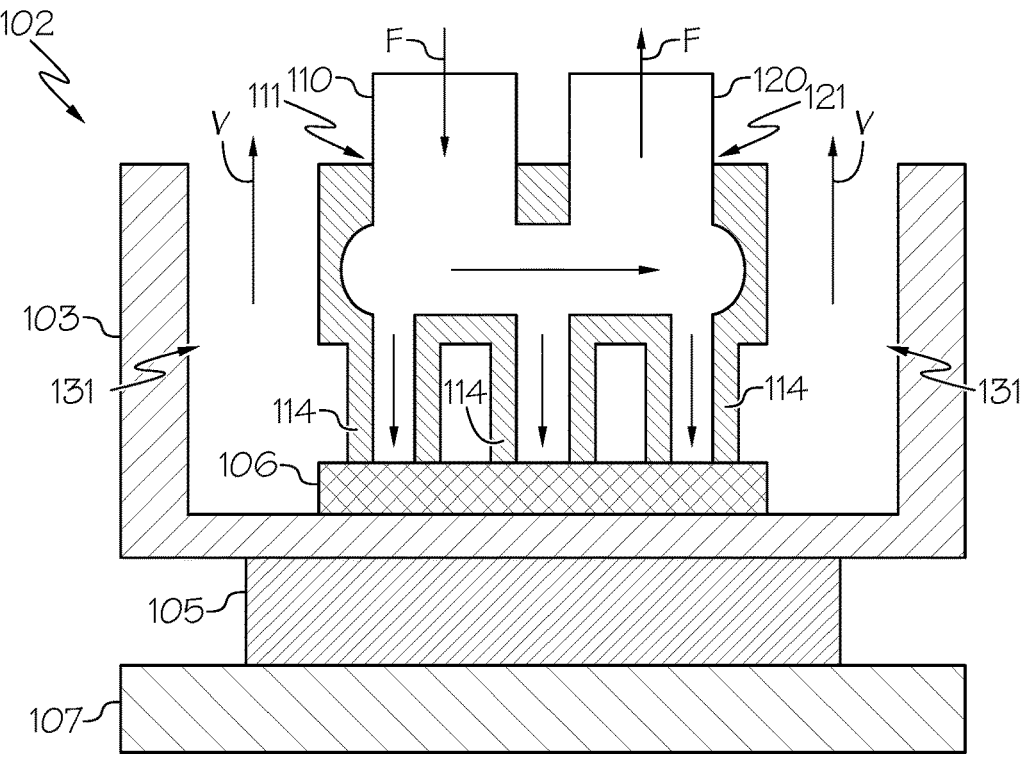
FIG. 3 schematically depicts an electronic device with a wick according to one or more embodiments shown and described herein.

The example system 100 of FIG. 1 further includes a vapor line 130 that is fluidly coupled to one or more vapor outlets 131 of the capillary cooler 102 (see FIG. 3). The other end of the vapor line 130 is fluidly coupled to an input of the condenser 140. Evaporated fluid flows out of the capillary cooler 102, through the vapor line 130, and into the condenser 140 where it is condensed back into a liquid.

A fluid bypass line 120 is provided at a fluid bypass outlet 121 of the capillary cooler 102 (see FIG. 3). Thus, the fluid bypass line 120 is fluidly coupled to the capillary cooler 102 at one end. The other end of the fluid bypass line 120 is fluidly coupled to an input of the condenser 140. It is noted that the fluid bypass line 120 and the vapor line 130 may be fluidly coupled together prior to the condenser to provide a single condenser input in some embodiments. The fluid bypass outlet 121 and fluid bypass line 120 allow some fluid to bypass the plurality of feeding tubes 114.

The fluid bypass line 120 further includes a fluid bypass valve 126. The fluid bypass valve 126 may be placed at any point along the fluid bypass line 120 between the capillary cooler 102 and the condenser 140. In one embodiment, the fluid bypass valve 126 is placed adjacent to the inlet 122 of the fluid bypass line 120. The fluid bypass valve 126 is operable between at least two different opening positions to regulate the amount of fluid that bypasses the plurality of feeder tubes. The fluid bypass valve 126 is controlled to adjust the system pressure and extend the capillary cooler performance. As a non-limiting example, the fluid bypass valve may be operable between a first position at 0-percent open (in other words, closed), a second position at 30-percent open, a third position at 60-percent open, a fourth position at 100-percent open, or any other position corresponding to any other percentage open in order to precisely control the flow of the fluid.

The fluid bypass valve 126 may be any suitable type of valve, including but not limited to a gate valve, a ball valve, a butterfly valve, a globe valve, or any other suitable type of valve to control the flow of fluid. In some embodiments, the fluid bypass valve 126 may contain a handle or knob to allow manual manipulation of the fluid bypass valve 126 between the various positions. In some embodiments, the fluid bypass valve 126 is computer controlled.

In the illustrated embodiment, the system 100 includes a controller 150 for controlling components of the system 100, such as the fluid bypass valve 126 and the pump 104. The system 100 further may include a temperature sensor 158. The temperature sensor 158 may be coupled to the one or more electronic devices 105 and/or the capillary cooler 102. While a single temperature sensor 158 is shown, it should be understood that any number of temperature sensors 158 may be included. In some embodiments there may be a temperature sensor 158 coupled to each electronic device 105. In some embodiments, there may be a plurality of temperature sensors 158 coupled to each electronic device 105 such that the plurality of temperature sensors 158 may monitor the temperature of the electronic device 105 in multiple places across the electronic device 105.

The temperature sensor 158 communicatively coupled to the controller 150. The temperature sensor 158 may generate an electronic signal corresponding to the detected temperature of the electronic device 105 (i.e., temperature data). The temperature sensor 158 may transmit the electronic signal to the controller 150. The controller 150 may compare the electronic signal corresponding to the detected temperature to a predetermined threshold temperature stored in a non-transitory, processor-readable storage medium that is either a component of the controller 150 or a remote component. The predetermined threshold temperature may be specified by an operator. If the detected temperature exceeds the threshold temperature, the processor of the controller 150 may send a signal to the pump 104 to activate the pump 104 and pump fluid to the electronic device 105. In some embodiments, the pump 104 may be a variable speed pump. The controller 150 may vary the speed of the pump 104 in response to the electronic signal corresponding to the detected temperature in order to more precisely control the flow of the fluid to maintain the electronic devices 105 at a preferred operating temperature. The controller 150 may also deactive the pump 104 if the controller 150 determines fluid is no longer needed at the electronic device 105.

Further, if the detected temperature exceeds the threshold temperature, the processor of the controller 150 may send a signal to the fluid bypass valve 126 to open to a prescribed position and allow more or less fluid to flow through the fluid bypass line 120. The fluid bypass valve 126 may be coupled to a stepper motor or other suitable mechanism that may open the valve at various opening positions. For example, the controller 150 may send a signal to the stepper motor coupled to the fluid bypass valve 126 to adjust the fluid bypass valve 126 to allow more or less fluid to flow through the fluid bypass line 120.

In another embodiment, an operator may enter a specified temperature into a user interface that is operable to provide settings to the controller 150. The user interface may be for example a touch screen, a keypad, a mobile computing device, or any other suitable user interface. The controller 150 may store the specified temperature in the non-transitory, processor-readable storage medium. If the detected temperature exceeds the specified temperature, the processor of the controller 150 may send a signal to the pump 104 to pump fluid to the capillary cooler 102, or the controller 150 may send a signal to the fluid bypass valve 126 to open the fluid bypass valve 126 to a specified position to allow more or less fluid to flow through the fluid bypass line 120.

The controller 150 may also be configured to monitor the power consumption level of the electronic device 105, such that the electronic device 105 transmits an electronic signal corresponding to the power consumption level of the electronic device 105. The controller 150 may compare the electronic signal corresponding to the power consumption level to a predetermined threshold power consumption level. The predetermined threshold power consumption may be specified by an operator, for example. If the detected power consumption level exceeds the threshold power consumption, the processor of the controller 150 may send a signal to the pump 104 to move fluid to the capillary cooler 102. The controller 150 may vary the speed of the pump 104 in response to the electronic signal corresponding to the detected power consumption level in order to more precisely control the flow of the fluid in response to the detected power consumption level.

Further, if the detected power consumption level exceeds the threshold power consumption level, the processor of the controller 150 may send a signal to the fluid bypass valve 126 to open to a prescribed position and allow less fluid to flow through the fluid bypass line 120, which causes more fluid to move to the capillary cooler 102. The fluid bypass valve 126 may be coupled to a stepper motor or other suitable mechanism that may open the valve at various opening positions. For example, the controller 150 may send a signal to the stepper motor coupled to the fluid bypass valve 126 to adjust the fluid bypass valve 126 to allow more or less fluid to flow through the fluid bypass line 120 in response to the detected power consumption level.

In another embodiment, an operator may enter a specified power consumption level into the user interface of the controller 150. The controller 150 may store the specified power consumption level in the non-transitory, processor-readable storage medium. If the detected power consumption level exceeds the specified temperature, the processor of the controller 150 may send a signal to the pump 104 to move fluid through the fluid feed line 110.

In other embodiments, it is envisioned that one or more fluid flow meters may be placed along the system 100 in order to measure the flow of fluid within the system 100. As a non-limiting example, a first fluid flow meter may be placed between the fluid bypass valve 126 and the condenser 140, and a second fluid flow meter may be placed between the pump 104 and the capillary cooler. Each of the fluid flow meters may be coupled to the controller 150, such that the controller 150 may receive an electronic signal from each of the fluid flow meters corresponding to the flow rate of the fluid within the system 100.

Thus, the fluid bypass valve 126 may be open control, or may be proportional control using a feedback loop of one or more of temperature, power consumption and flow rate. In further embodiments, the fluid bypass valve 126 may be proportional-integral control or proportional-integral-derivative control using a feedback loop of one or more of temperature, power consumption and flow rate.

The system 100 may be arranged in any suitable environment. In one embodiment, the system 100 is arranged to cool electronic devices 105 placed in a data center. The data center may be a facility which houses a large number of vertical stacks of electronic devices 105 in one or more rooms. In other embodiments, the data center may house a small number of vertical stacks of electronic devices 105. In yet further embodiments, the data center may house a single electronic device 105.

In yet further embodiments, the system 100 may be arranged in an automobile for cooling an onboard electronic device 105. The automobile may be an electric vehicle, an internal combustion vehicle, a hybrid vehicle, a fuel cell vehicle, or any other type of automobile. The onboard electronic device 105 may be an electric motor, battery pack, charging system, inverter circuits such as IGBTs or MOSFETS, or any other electronic device 105 with variable power utilization.

In further embodiments not illustrated, the system 100 may include a fluid reservoir to increase the capacity of fluid within the system 100.

Figure 2:
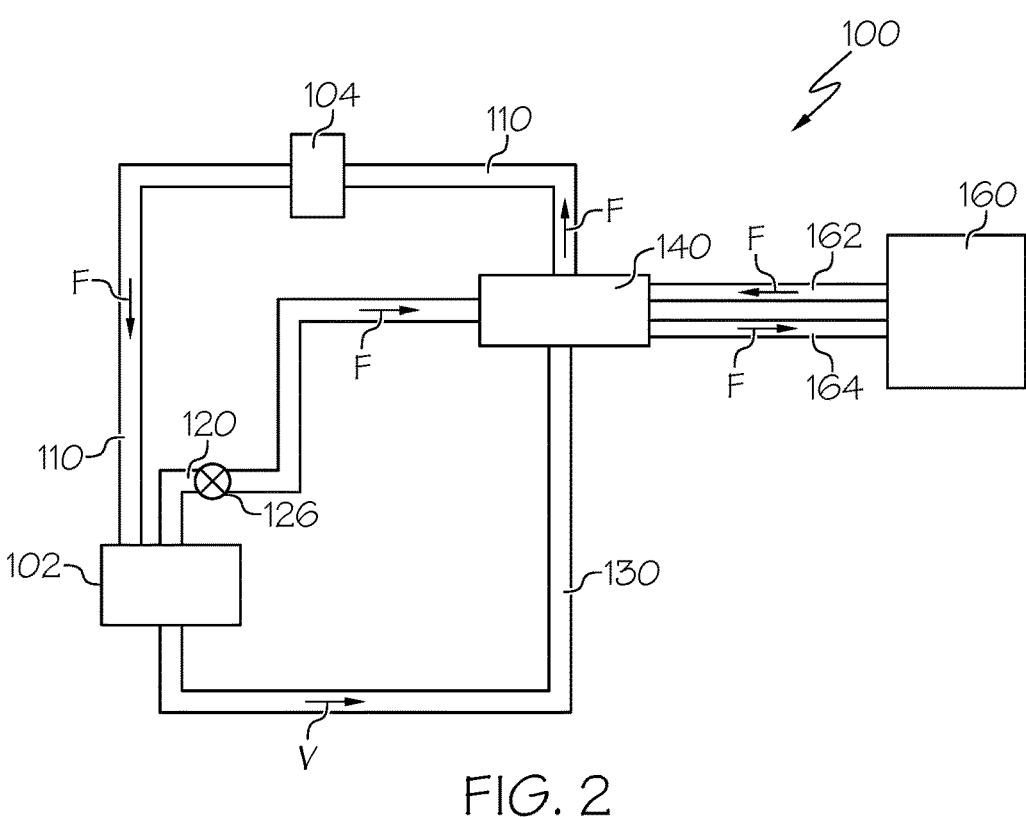
FIG. 2 schematically depicts a system for cooling electronic devices according to one or more embodiments shown and described herein.

Referring now to FIG. 2, an example embodiment of the system 100 with a heat exchanger 160 is shown. The heat exchanger 160 includes an inlet 162 and an outlet 164. The inlet 162 and the outlet 164 are fluidly coupled to the condenser 140. The heat exchanger 160 may flow a heat exchanger fluid across the condenser to cool the fluid passing through the condenser 140. The heat exchanger 160 may be cooled by any suitable cooling system, including but not limited to geothermal cooling wherein a condenser cooling fluid from the geothermal system is moved from below the ground underneath the facility and the condenser cooling fluid from the geothermal system is passed across the condenser 140 to cool the fluid passing through the condenser 140. The condenser 140 may also be cooled by radiative cooling wherein condenser cooling fluid is moved across a radiative cooling panel which may be a panel of high solar reflectance and with a high thermal radiation heat transfer rate such that the condenser cooling fluid is cooled, and the condenser cooling fluid is then passed across the condenser 140. The condenser 140 may also be cooled by the HVAC system of the facility, wherein cooled air from a conventional air conditioning system may be moved across the condenser 140. The condenser 140 may also be cooled by any other appropriate cooling mechanism.

Referring now to FIG. 3, an example capillary cooler 102 coupled to an electronic device 105 is shown. The fluid feed line 110 is fluidly coupled to an input 111 at a housing 103 of the capillary cooler 102, which is further fluidly coupled to a plurality of feeding tubes 114. Thus, fluid enters the input 111 and then flows through the plurality of feeding tubes 114.

A wick 106 is provided at the base of the housing 103 and is positioned to receive fluid from the plurality of feeding tubes 114. The wick 106 is arranged so that it is vertically aligned with the electronic device 105. In some embodiments, the electronic device 105 is at least partially maintained within the housing 103 (e.g., within an opening of the base of the housing 103) such that the wick 106 is provided directly on the electronic device 105.

The wick 106 may draw fluid down in the direction of the electronic device 105, which is shown as being mounted on a printed circuit board 107 or other substrate. In some embodiments, a thermal interface material may be placed between the electronic device 105 and the housing 103, or in some cases the wick 106. The thermal interface material may be for example a thermal paste, or any other suitable thermal interface material.

The capillary cooler 102 further includes one or more vapor outlets 131 for removing vapor from the capillary cooler 102. Fluid flows through the plurality of feeding tubes 114 and enters the wick 106 where it is heated to its evaporation point by the electronic device 105 and is turned into vapor. The vapor rises and exits the capillary cooler 102 at the vapor outlet 131, where it then flows through the vapor line 130 and into the condenser 140.

Figures 4A, 4B, 4C:
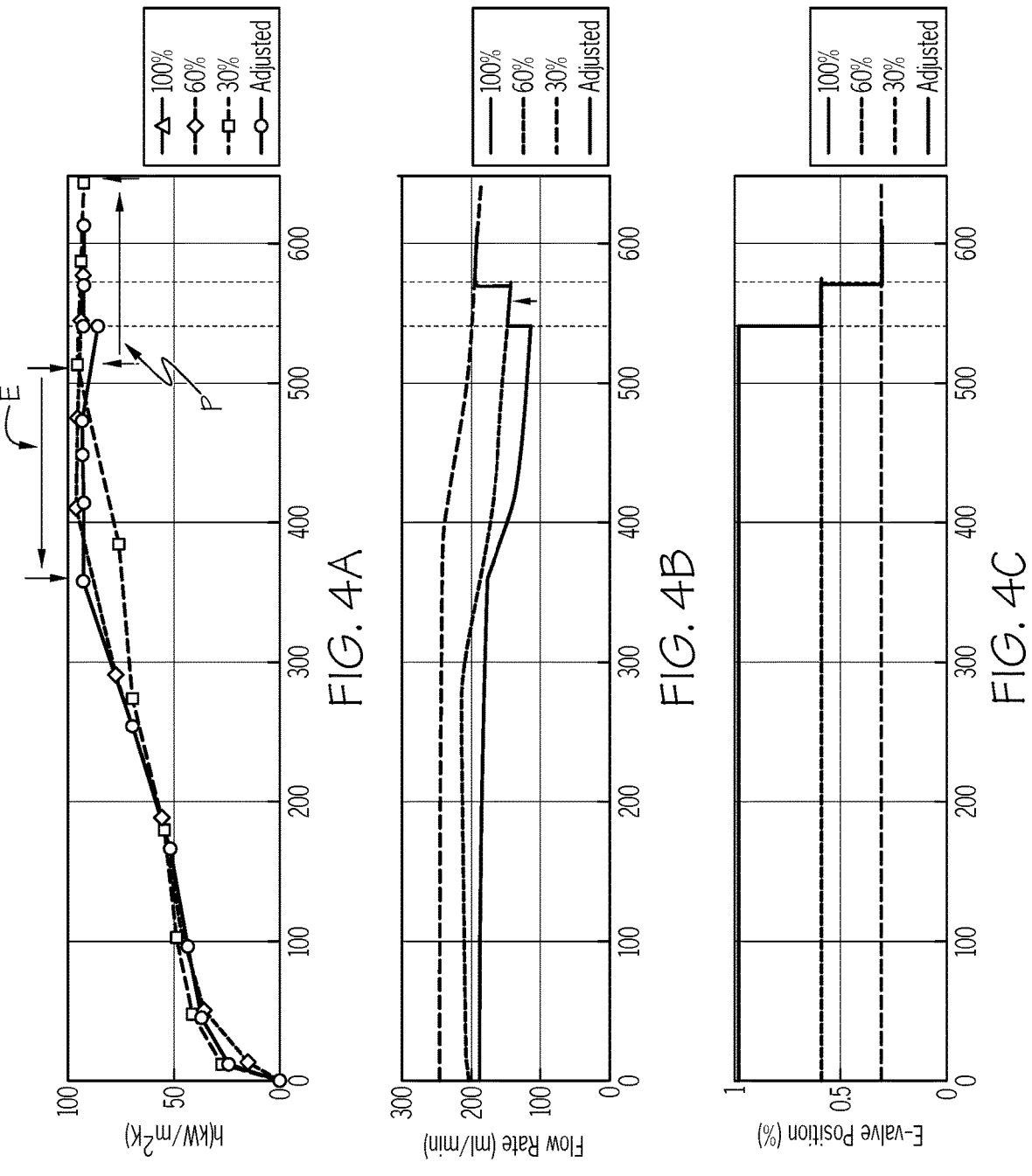
FIG. 4A schematically depicts a graphical output of the heat flux of the system for cooling electronic devices according to one or more embodiments shown and described herein.
FIG. 4B schematically depicts a graphical output of the flow rate of the system for cooling electronic devices according to one or more embodiments shown and described herein.
FIG. 4C schematically depicts a graphical output of the position of a fluid bypass valve according to one or more embodiments shown and described herein.

The system 100 of FIG. 2 was experimentally evaluated by four trials. In three of the trials, the fluid bypass valve was kept fixed for the duration of the test and the power of the electronic device was increased to measuring cooling performance. The three settings for the fluid bypass valve was 100-percent open, 60-percent open, and 30-percent open. In a fourth trial, the position of the fluid bypass valve was dynamically adjusted. FIGS. 4A-4C illustrate the outcome of the experimental trials. FIG. 4A plots the heat flux density over increasing power of the electronic device, FIG. 4B plots the flow rate within the capillary cooler over increasing power of the electronic device, and FIG. 4C plots the valve position over increasing power of the electronic device.

When the valve was kept 100-percent open, evaporative cooling was observed at about 350 W. However, evaporative cooling was observed at about 500 W for the 30-percent open setting. Thus, the 100-percent open position advantageously lowers the power for evaporative cooling as indicated by arrow E. Additionally, the maximum power using the 100-percent open setting was about 500 W, while with the 30-percent open setting the maximum power increased to 650 W, as indicated by arrow P.

To achieve optimal performance, evaporative cooling is desired at the lowest possible power and should last as long as possible. This may be achieved by modulating the position of the fluid bypass valve to extend performance, as shown by the fourth experiment which was manually performed at discrete times to achieve early evaporative cooling transition and to extend the maximum power.

Figure 5:
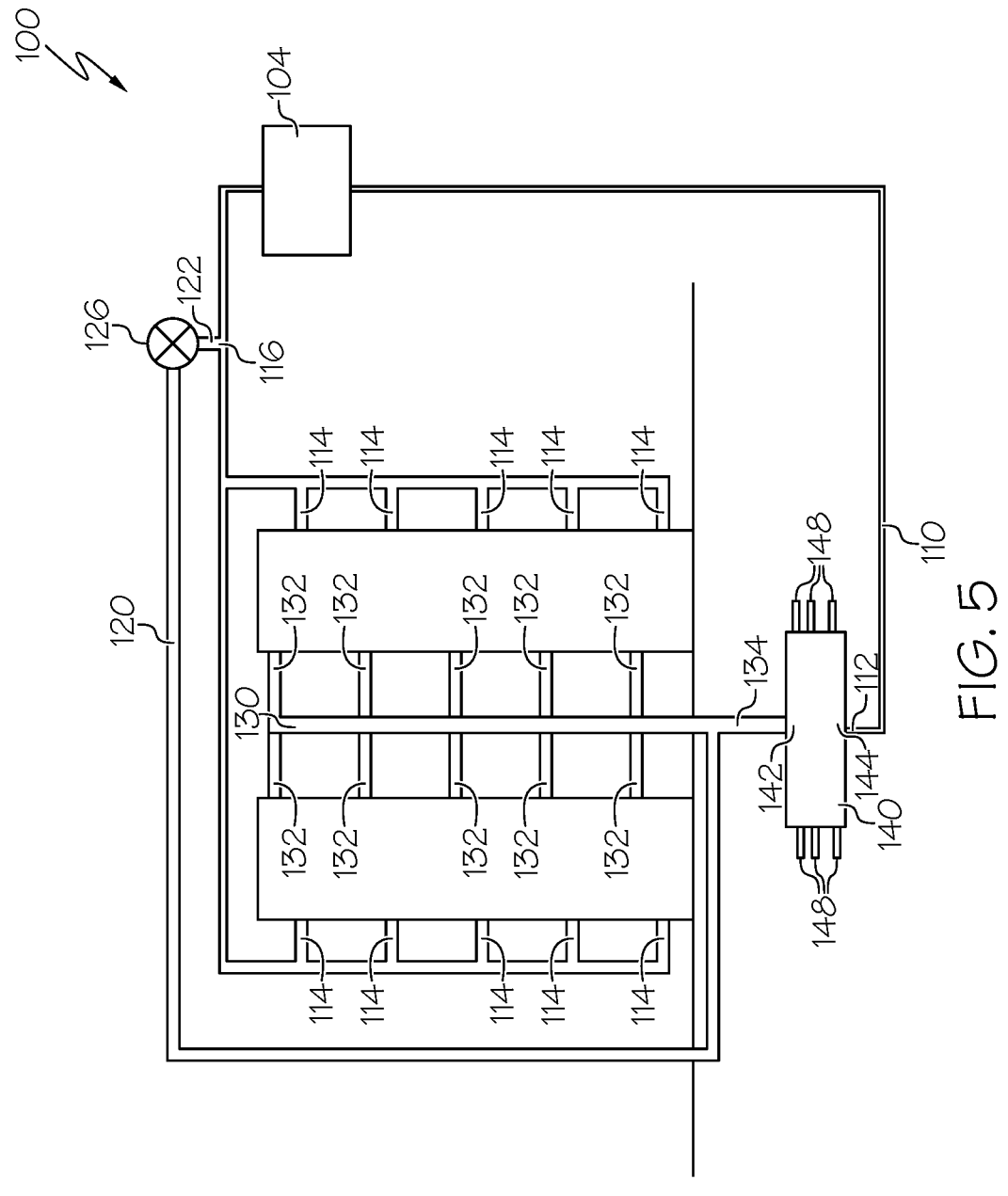
FIG. 5 schematically depicts a system for cooling electronic devices according to one or more embodiments shown and described herein.

The cooling systems described herein may be employed in any setting or environment. Referring now to FIG. 5, an embodiment of the system 100 wherein a plurality of electronic devices 105 are arranged in vertical stacks is shown. As a non-limiting example, the vertical stacks of electronic devices 105 may be arranged in a data center. Each vertical stack may have any number of electronic devices 105. The system 100 may include any number of vertical stacks of electronic devices 105. The system 100 includes a plurality of feeding tubes 114 of the fluid feed line 110. Each feeding tube 114 of the fluid feed line 110 may be fluidly coupled to one or more electronic devices 105. The system 100 further includes a plurality of inlets 132 of the vapor line 130. Each inlet 132 may be fluidly coupled to the one or more electronic devices 105. The fluid bypass line 120 may be arranged so that fluid may bypass the capillary coolers 102 (not shown) of the vertical stacks of electronic devices 105. As illustrated, fluid may bypass all of the capillary coolers 102 of the vertical stacks of electronic devices 105, but it should be understood that in other embodiments fluid may bypass a portion of the capillary coolers 102 of the vertical stacks of electronic devices 105.

Figure 6:
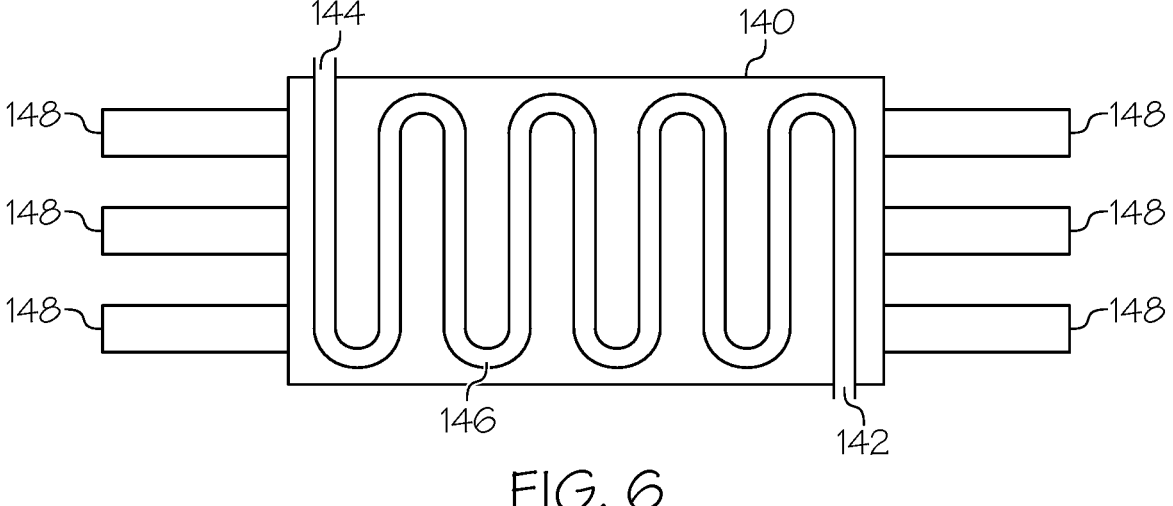
FIG. 6 schematically depicts a condenser according to one or more embodiments shown and described herein.

Referring now to FIG. 6, a sectional view of an embodiment of the condenser 140 is shown. The condenser 140 includes the inlet 142 and the outlet 144. The condenser may have one or more fins 148. The fins 148 may allow for heat from the fluid to be dissipated more efficiently compared to a condenser without fins. The condenser 140 may include a channel 146 to allow the fluid to flow from the condenser inlet 142 to the condenser outlet 144.

Figure 7:
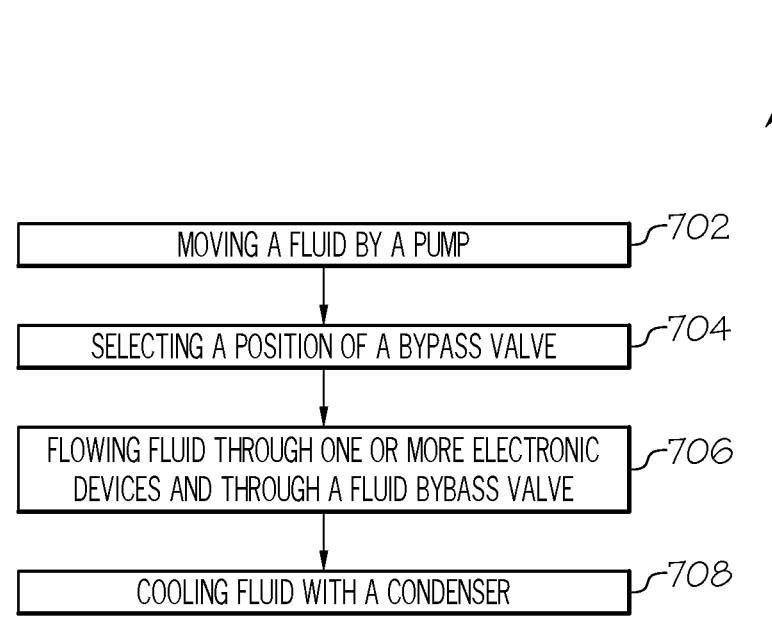
FIG. 7 schematically depicts a flowchart of an illustrative method for cooling electronic devices.

Referring now to FIG. 7, the steps of a method for cooling electronics is described. With reference to FIGS. 1-6, at block 702, the method 700 includes moving the fluid by the one or more pumps 104.

At block 704, the method 700 includes selecting a position of the fluid bypass valve 126.

At block 706, the method 700 includes flowing the fluid by the pump 104 through the fluid bypass valve 126 and the one or more electronic devices 105. That is, the pump 104 moves fluid along the fluid feed line 110 where at least a portion of the fluid flows through the fluid bypass valve 126 and the remaining portion of the fluid flows through the one or more electronic devices 105.

At block 708, the method 700 includes cooling the fluid with the condenser 140. That is, fluid enters the condenser 140 through the vapor line 130 and the fluid bypass line 120 and is cooled so that the fluid may be pumped through the fluid feed line 110 a subsequent time.

Figure 8:
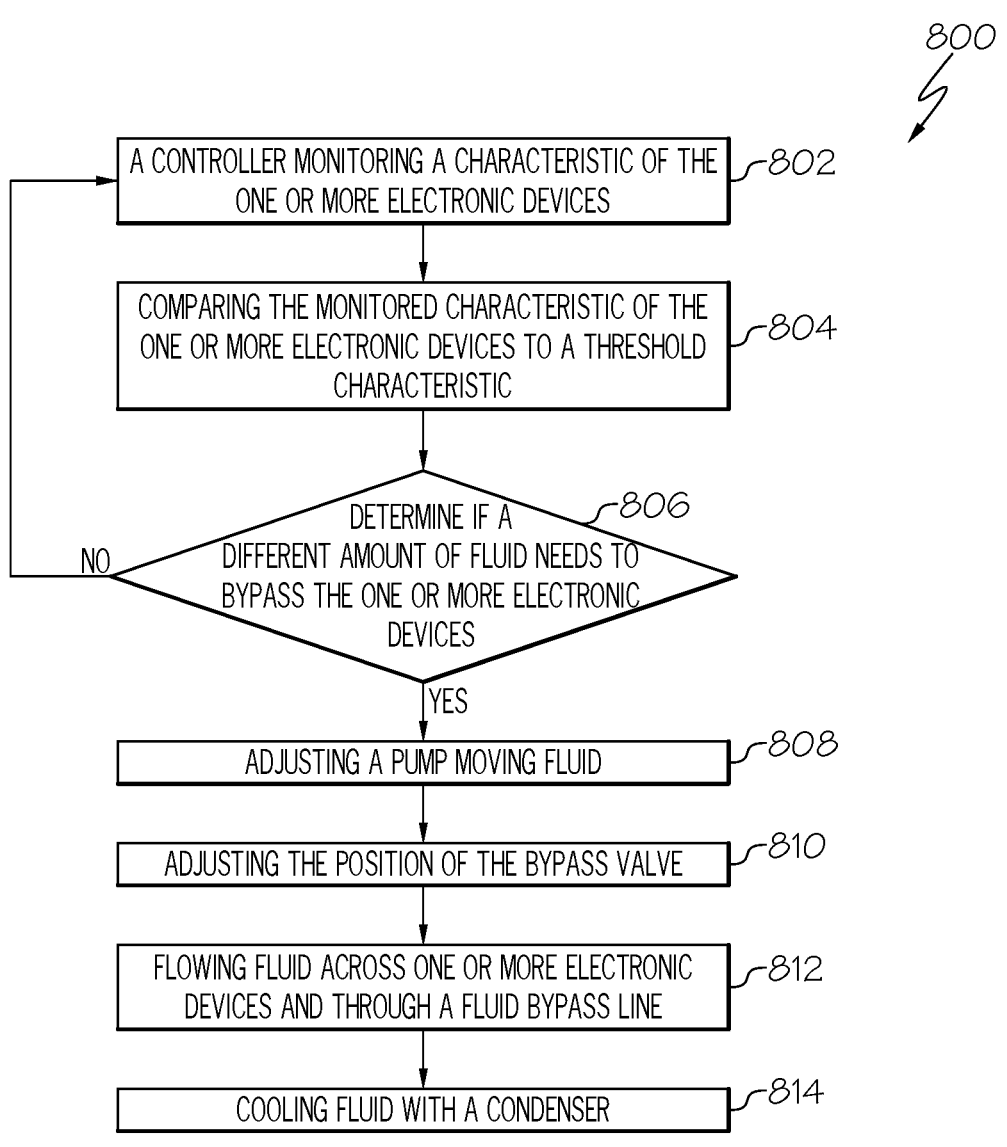
FIG. 8 schematically depicts another flowchart of an illustrative method for cooling electronic devices.

Referring now to FIG. 8, the steps of a method for cooling electronics is described. With reference to FIGS. 1-6, at block 802, the method 800 includes the controller 150 monitoring a characteristic of the one or more electronic devices 105. The characteristic may be a power consumption level of the electronic devices 105, wherein the controller 150 is coupled to the electronic device 105. The characteristic may also be a temperature of the electronic device 105, wherein there is a temperature sensor 158 mounted to the electronic device 105 and the temperature sensor 158 is coupled to the controller 150.

At block 804, the method 800 includes the controller 150 comparing the monitored characteristic of the electronic device 105 to a threshold characteristic. That is, a threshold characteristic may be stored on the non-transitory, processor-readable storage medium and the controller 150 may compare the monitored characteristic to the stored threshold characteristic. The characteristic may be a temperature of an electrical consumption level.

At block 806, the method 800 includes determining if the fluid bypass valve 126 needs to be adjusted based on the outcome of comparing the monitored characteristic of the electronic device 105 with the threshold characteristic. For example, if the monitored characteristic of the electronic device 105 is greater than the threshold characteristic, the controller 150 may determine that the fluid bypass valve 126 needs to be adjusted. If it is determined that the fluid bypass valve 126 needs to be adjusted (block 806="YES"), the method proceeds to the step described at block 808. If it is determined that the fluid bypass valve 126 does not need to be adjusted (block 806="NO"), the method proceeds to the step described at block 802.

At block 808, the method 800 includes adjusting a pump 104 to move additional fluid. That is, the pump 104 may receive a signal from the controller 150 for the pump 104 to move additional fluid to the fluid bypass valve 126 or the electronic devices 105.

At block 810, the method 800 includes adjusting the position of the fluid bypass valve 126. That is, the fluid bypass valve 126 my receive a signal from the controller 150 for the fluid bypass valve 126 to move from a first position to a second position such that a different amount of fluid may bypass the one or more electronic devices 105 and flow directly from the fluid feed line 110 to the condenser 140.

At block 812, the method 800 includes flowing the fluid through the one or more electronic devices 105 and through the fluid bypass line 120.

At block 814, the method 800 includes cooling the fluid with the condenser 140. The fluid may then be re-pumped through the fluid feed line 110 while the controller 150 continues to monitor characteristics of the one or more electronic devices 105, such that the controller may repeat the step of adjusting the fluid bypass valve 126 as many times as is necessary.

Accordingly, embodiments of the present disclosure provide electrically-efficient cooling systems for cooling electronic devices. Particularly, a fluid bypass valve is controllable to adjust how much fluid is provided to the wick of a capillary cooler to both provide an early transition to evaporative cooling, and extend the maximum power of the capillary cooler. More particularly, the system includes at least one pump. The pump is fluidly coupled to a fluid feed line. The fluid feed line is coupled to one or more capillary coolers. The capillary coolers are coupled to wicks configured on electronic devices. The fluid feed line is further coupled to a fluid bypass line. The fluid bypass line has a fluid bypass valve disposed therein. The fluid bypass valve is operable between a plurality of opening positions such that a portion of fluid may bypass the one or more electronic devices. The electronic devices may evaporate the fluid when fluid is passed through the capillary cooler configured on the wick on the electronic device. A vapor line is fluidly coupled to the capillary cooler wherein the evaporated fluid may flow through the vapor line. The vapor line and the fluid bypass line are fluidly coupled to a condenser which may condense the vapor into a fluid and further cool the bypassed fluid. The condenser is fluidly coupled to the pump so the fluid may be pumped back to the fluid feed line.

It may be noted that one or more of the following claims utilize the terms "where," "wherein," or "in which" as transitional phrases. For the purposes of defining the present technology, it may be noted that these terms are introduced in the claims as an open-ended transitional phrase that are used to introduce a recitation of a series of characteristics of the structure and should be interpreted in like manner as the more commonly used open-ended preamble term "comprising."

It should be understood that any two quantitative values assigned to a property may constitute a range of that property, and all combinations of ranges formed from all stated quantitative values of a given property are contemplated in this disclosure.

Having described the subject matter of the present disclosure in detail and by reference to specific embodiments, it may be noted that the various details described in this disclosure should not be taken to imply that these details relate to elements that are essential components of the various embodiments described in this disclosure, even in casings where a particular element may be illustrated in each of the drawings that accompany the present description. Rather, the claims appended hereto should be taken as the sole representation of the breadth of the present disclosure and the corresponding scope of the various embodiments described in this disclosure. Further, it will be apparent that modifications and variations are possible without departing from the scope of the appended claims.

What is claimed is:

1. A system for cooling electronic devices, the system comprising:

one or more electronic devices;

a capillary cooler assembly comprising a housing, a plurality of feeding tubes within the housing, a wick within the housing, and one or more vapor outlets;

a fluid feed line fluidly coupled to the plurality of feeding tubes;

a fluid bypass line fluidly coupled to the fluid feed line;

a fluid bypass valve fluidly coupled to the fluid feed line and the fluid bypass line, wherein the fluid bypass valve is selectively operable between at least two positions that control a flow of cooling fluid through the fluid bypass line;

a vapor line fluidly coupled to the one or more vapor outlets;

a condenser fluidly coupled to the fluid bypass line, the vapor line, and the fluid feed line; and a pump fluidly coupled to the condenser and the fluid feed line.

2. The system of claim 1, further comprising a controller operable to selectively move the fluid bypass valve between at the least two positions.

3. The system of claim 2, wherein the controller selectively moves the fluid bypass valve by open loop control.

4. The system of claim 2, further comprising a temperature sensor operable to monitor temperature of the one or more electronic devices, wherein the temperature sensor provides temperature data to the controller such that the controller selectively moves the fluid bypass valve between the at least two positions based at least in part on the temperature data.

5. The system of claim 4, wherein the controller selectively moves the fluid bypass valve by at least one of: (1) proportional control, (2) proportional-integral control, or (3) proportional-integral-derivative control.

6. The system of claim 2, wherein the controller is operable to monitor a power consumption of the one or more electronic devices and selectively move the fluid bypass valve between the at least two positions based at least in part on the power consumption.

7. The system of claim 1, further comprising a controller operable to control the pump.

8. The system of claim 1, further comprising a heat exchanger fluidly coupled to the condenser.

9. The system of claim 1, wherein the at least two positions comprises 100-percent open, 60-percent open, and 30-percent open.

10. A data center comprising:

one or more electronic devices;

a system for cooling the one or more electronic devices comprising:

a capillary cooler assembly comprising a housing, a plurality of feeding tubes within the housing, a wick within the housing, and one or more vapor outlets;

a fluid feed line fluidly coupled to the plurality of feeding tubes;

a fluid bypass line fluidly coupled to the fluid feed line;

a fluid bypass valve fluidly coupled to the fluid feed line and the fluid bypass line, wherein the fluid bypass valve is selectively operable between at least two positions that control a flow of cooling fluid through the fluid bypass line;

a vapor line fluidly coupled to the one or more vapor outlets;

a condenser fluidly coupled to the fluid bypass line, the vapor line, and the fluid feed line; and a pump fluidly coupled to the condenser and the fluid feed line.

11. The data center of claim 10, further comprising a controller operable to move the fluid bypass valve between positions.

12. The data center of claim 11, wherein the controller selectively moves the fluid bypass valve by open loop control.

13. The data center of claim 11, further comprising a temperature sensor operable to monitor temperature of the one or more electronic devices, wherein the temperature sensor provides temperature data to the controller such that the controller selectively moves the fluid bypass valve between the at least two positions based at least in part on the temperature data.

14. The data center of claim 13, wherein the controller selectively moves the fluid bypass valve by proportional control.

15. The data center of claim 12, wherein the controller is operable to monitor a power consumption of the one or more electronic devices and selectively move the fluid bypass valve between the at least two positions based at least in part on the power consumption.

16. The data center of claim 11, wherein the at least two positions comprises 100-percent open, 60-percent open, and 30-percent open.

* * * * *